United States Patent [19]

Pang

[11] Patent Number: 5,688,383

[45] Date of Patent: Nov. 18, 1997

[54] METHOD FOR IMPROVING THE PERFORMANCE OF HIGH TEMPERATURE SUPERCONDUCTING THIN FILM WAFERS

[75] Inventor: Philip Shek Wah Pang, Media, Pa.

[73] Assignee: E. I. du Pont de Nemours and Company, Wilmington, Del.

[21] Appl. No.: 603,838

[22] Filed: Feb. 22, 1996

[51] Int. Cl.$^6$ ................................................. H01L 39/00
[52] U.S. Cl. ................ 204/192.24; 204/192.34; 204/192.36; 505/728; 505/783
[58] Field of Search .................. 204/192.34, 192.36; 505/410, 411, 728, 470, 783

[56] References Cited

U.S. PATENT DOCUMENTS

| | | | |
|---|---|---|---|
| 4,966,885 | 10/1990 | Hebard | 505/1 |
| 5,091,048 | 2/1992 | Thomas | 156/643 |
| 5,270,294 | 12/1993 | Wu et al. | 505/1 |
| 5,342,828 | 8/1994 | Kountz et al. | 505/238 |
| 5,350,499 | 9/1994 | Shibaike et al. | 204/192.34 |

FOREIGN PATENT DOCUMENTS

| | | | |
|---|---|---|---|
| 0 477 063 | 3/1992 | European Pat. Off. | H01L 39/22 |
| 5-175562 | 7/1993 | Japan | H01L 39/24 |

OTHER PUBLICATIONS

Goodyear, S.W. et al, *IEEE Transactions on Applied Superconductivity*, 5(2), 3143–3146 (1995).

DiLorio, M.S. et al, *Appl. Phys. Lett*, 67(13), 1926–1928 (1995).

Shen, Z. et al, *IEEE Transactions on Microwave Theory and Techniques*, 40(12), 2424–2432 (1992).

Williams, R. E., *Gallium Arsenide Processing Techniques*, Chapter 9, Artech House (1984).

Suzuki, T. et al, *Proceedings of the Sixth Inter. Symp. on Superconductivity*, Oct. 1993.

Shen, Z., *High Temp Superconducting Microwave Circuits*, Chapter 2, Artech House (1994).

Nagai, Y. et al, *Japanese Journal of Applied Physics*, 30(11A), 2751–2755 (1991).

Manuscript: Marathe, A.P. et al, "Process Issues and Components for HTS Digital Integrated Circuit Fabrication", Oct. 17, 1994.

Manuscript: Wilker, C. et al, "A Sapphire Resonator for Microwave Characterization of Superconducting Thin Films", Aug. 24, 1992.

Holstein, W.L. et al, *Materials Research Society Symposium Proceedings*, vol. 275, pp. 241–x346 (1992).

Holstein, W.L. et al, *1992 Appl. Superconductivity Conf.*, (Aug. 1992).

*Primary Examiner*—R. Bruce Breneman
*Assistant Examiner*—Michael E. Adjodha

[57] ABSTRACT

A method for decreasing the microwave surface impedance of high-temperature superconducting thin films comprises (a) applying, preferably by spin-coating, a protective coating (preferably poly(methyl methacrylate) or polyimide) to the surface of a high-temperature superconducting thin film, such as $Tl_2Ba_2CaCu_2O_8$; (b) exposing the coated thin film to low angle ion milling at an incident angle of 5° to 30° (preferably 10° to 20°) relative to the surface of the coated film; and (c) optionally including the step of removing any residual protective coating from the surface of the thin film, such as by exposure to an oxygen plasma.

17 Claims, 1 Drawing Sheet

METHOD FOR IMPROVING THE PERFORMANCE OF HIGH TEMPERATURE SUPERCONDUCTING THIN FILM WAFERS

FIELD OF THE INVENTION

This invention pertains to a method for improving the performance of high temperature superconducting (HTS) thin films after they have been deposited. More specifically, this invention pertains to a method for reducing asperity in already fabricated HTS thin films by the use of an inert ion beam etching technique called low angle ion milling (LAIM).

BACKGROUND

Inert ion beam etching of a patterned HTS wafer is a common practice in the art. See for example, Chapter 9 of *Gallium Arsenide Processing Techniques*, R. E. Williams, Artech House, 1984. Under normal circumstances in the art, the ion beam direction is normal to the surface, while good practice dictates that the beam diameter exceed that of the film being treated. It is also known in the art to apply the technique of inert ion beam etching to creating shaped three dimensional structures within the pattern applied to the HTS film, sometimes by causing the beam to deviate from normal incidence. For example, Goodyear et al., *IEEE Transactions on Applied Superconductivity*, Volume 5, p. 3143ff, June, 1995, disclose incident beam angles of as much as 45° off normal. See also M. S. Dilorio et al., *Applied Physics Letters*, Volume 67, Sep. 25, 1995.

The known art on the use of inert ion beams, exemplified by the references mentioned above, is directed to the use of such beams to create structures and patterned elements on the surface of the HTS film. The process of the present invention, by contrast is directed at removing features from the surface of an HTS film by the use of far-from-normal (i.e.; 60°–85°) incidence inert ion beams. Specifically, unlike the prior art uses of inert ion beams, the present invention provides for the use of an inert ion beam to remove surface asperities (i.e, structure) from HTS films.

In the art of fabricating HTS thin films, it is known to form the elements of the superconducting composition into the final superconducting film by various combinations of deposition and consolidation techniques. See e.g., W. L. Holstein et al., *Materials Research Society Symposium Proceeding*, Volume 275, 1992, and in T. Suzuki et al., *Proceedings of the Sixth International Symposium on Superconductivity*, October 1993. The surfaces of the HTS films so fabricated are frequently rough because of outgrowths and defects that form during deposition. This is particularly true of $Tl_2Ba_2CaCu_2O_8$ HTS films deposited by the technique known as the two-step post-anneal process which is described by Zhi-Yuan Shen in Chapter 2 of *High Temperature Superconducting Microwave Circuits*, published by Artech House, 1994, and in W. L. Holstein et al., 1992 *Applied Superconductivity Conference*, August 1992. It is found in the practice of that art that the microwave surface impedance of the HTS films is adversely affected by the presence of surface asperities. The present invention thus provides a novel method of removing surface asperities on HTS films and for improving (that is; lowering) the microwave surface impedance of such films.

SUMMARY OF THE INVENTION

This invention provides for a method of reducing asperity of HTS thin films, thereby causing a desirable decrease in the microwave surface impedance of an HTS thin film so treated, by exposing the film to an inert ion beam at an angle of incidence of no more than 30° with respect to the plane of the film (i.e.; at least 60° off normal). Thus, this invention provides a method for improving the power-handling capabilities of HTS films, and of improving production yields by providing a post-fabrication method for re-working a film exhibiting excess surface impedance.

In one embodiment, the invention essentially comprises a method for removing asperities from the surface of a HTS thin film by exposing the film to an inert ion beam at an angle of incidence of from 5 to about 30 degrees relative to the surface of the thin film.

In another embodiment, the invention comprises a method of reducing the microwave surface impedance of a HTS thin film by the steps of a) applying a protective coating over the surface of an HTS thin film; and b) exposing the coated thin film to an inert ion beam at an angle of incidence of from 5 to about 30 degrees with respect to the surface of the coated thin film.

BRIEF DESCRIPTION OF THE DRAWING FIGURE

DETAILED DESCRIPTION OF THE EMBODIMENTS

While the preferred embodiment of this invention is directed to thallium barium calcium copper oxide films, it will be clear to one skilled in the art that the techniques described herein may be readily adapted to other such superconducting films as may derive beneficial treatment therefrom.

As noted previously, it is well known that the surfaces of HTS films are frequently found to be rough as a result of the formation of outgrowths and defects during deposition. It is further known that the degree of surface irregularities or asperities present on a given film is determinative of the excess electrical impedance of the HTS film. The excess electrical impedance is defined as that portion of the impedance in excess of the impedance associated with a defect-free film. It is found in the practice of the art that a given set of fabrication conditions results in surface features of consistent size, although the number of such features may vary considerably from film to film, as indicated by considerable specimen to specimen variation in microwave surface impedance ("MSI").

It is found in the practice of the present invention that the microwave surface impedance of all specimens which have been prepared by a specific processing method according to a specific set of processing conditions, which specimens exhibit considerable specimen to specimen variability in MSI before being subjected to the present process, approach a common asymptotic limiting range of values after having been subject to low angle ion milling according to this invention. This limiting range of values so approached is believed to correspond to that of a defect-free specimen fabricated under the identical conditions. It will be clear to one skilled in the art that the particular limiting value, and the degree of specimen to specimen variability, will depend upon the specific processing method and set of processing conditions employed.

Figure 1A:
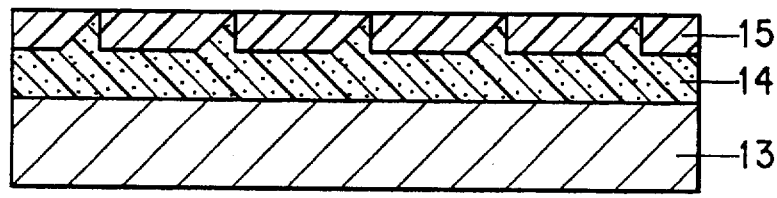
FIGS. 1A and 1B are schematic representations of an HTS film before and after the process of this invention.
Figure 1B:
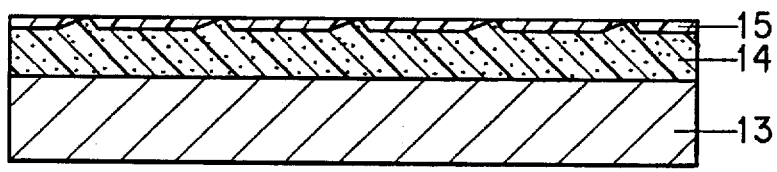

In the first step of the preferred process of this invention, a protective layer of an organic polymer, preferably poly (methyl methacrylate) ("PMMA") or polyimide ("PI") is applied to the surface of an HTS film. With reference to FIGS. 1A and 1B, the coating 15 is applied to HTS film 14 which has been deposited on a suitable substrate 13. The protective layer 15 may be applied by any method known in the art. The PMMA protective layer is preferably applied by spin-coating a 6% solution followed by curing at 170° C. for ca. 30 minutes.

The protective coating should ideally be of a thickness just equal to the height of the surface asperities to be removed as seen in FIG. 1A. If the protective coating is too thin, damage to the HTS film may result. If the coating is too thick, it will be necessary to subject the film to increased exposure to the beam, resulting in a corresponding increase in heat and potential damage to the HTS film. In addition, excess heat might cause thermal degradation of the protective coating, which makes the coating very difficult to remove after etching. While the height of surface features may vary depending upon the specific conditions of film deposition, it has been found that under the conditions employed in the studies leading to the present invention that a coating thickness of ca. 0.4 μm was optimal.

In the second step of the preferred process of this invention, the protectively-coated film is exposed to an inert ion beam, preferably an Argon ion beam. The angle of incidence of the beam may be in the range of 5°–30° relative to the surface of the film, with 10°–20° preferred. While not strictly necessary, the beam area preferably exceeds the surface area of the HTS film. The beam energy required will, of course, vary depending upon the composition of the HTS film being milled and other factors. In any event, it will be required that the beam energy must at least exceed the cohesive energy density of the surface asperities to be removed during milling. The required duration of exposure will depend upon the incident beam intensity and, of course, the desired end point of film MSI. The determination of the exposure time, however, is a matter well within the skill of the ordinary artisan and simply involves cycles of exposure and testing until the desired end point is obtained. Because surface asperities tend to be fairly uniform in size from specimen to specimen in films produced under the same conditions, once exposure time is determined for an HTS film made by a given process, that exposure time would be applicable to other films made under the same conditions.

It will be apparent to the skilled practitioner that the film needs to be properly positioned during the exposure step. While in principle, any material will suffice to hold the film, it has been found that many holders designed for conventional, normal incidence ion beam etching may, at the low incident angles employed in the present process, cast unacceptable shadows across the film surface and thus prevent the beam from contacting the film in the shadowed areas. Additionally, it has been found that beam contact with metallic parts of the holder, such as metallic retaining rings, result in contamination of the HTS film surface. Thus, retaining rings or other fabricated parts of a holder which may come into contact with the beam are preferably made of a polymeric substance, most preferably fluoropolymers or acetal polymers.

The manner in which the ion beam is formed and propagated is immaterial to the practice of the present invention. However, it has been found that commercially available Argon-ion beam etching equipment may be readily adapted to low-angle ion milling.

Figure 2:
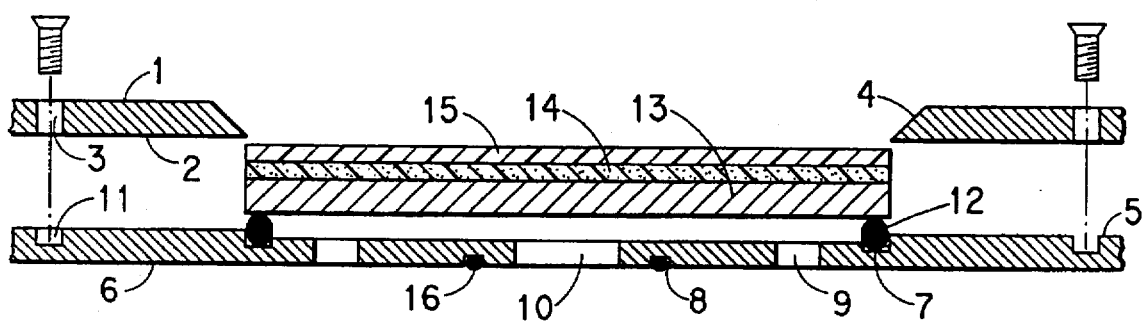
FIG. 2 is an elevational view, partly sectioned, of an adapter plate used to secure the HTS films in position during the exposure step of the present invention.

The temperature at the surface of the film during ion beam milling preferably should not exceed 120° C., otherwise there may be damage to the coating and the HTS film beneath. In the examples herein, which were conducted in a device designed for films of 15.2 cm (6 inch) diameter, an adapter plate was used in order to maintain sample alignment and position, reduce contamination and handling, and provide adequate cooling to the specimen. With reference to FIG. 2, the adapter plate comprises a cover ring with a front face 1 and a back face 2, and a base plate with a front face 5 and a back face 6. Holes 3 are drilled through the cover plate so that the cover plate can be affixed to the base plate by screws feeding through the cover plate into threaded holes 11 in the base plate. The cover ring is machined at a 10 degree angle 4. An O-ring groove 7 containing O-ring 12 is situated on the front face 5 of the base plate, and a smaller O-ring groove 8 containing O-ring 16 is situated on the back 6 of the base plate. Holes 9 are drilled through the base plate to permit the passage of helium coolant gas from the back to the front of the base plate, while a larger, center hole 10, within the O-ring groove 8 provides passage for the helium coolant gas from the front face 5 of the base plate to the back 6.

In use, the specimen (comprising a substrate 13, HTS film 14, and protective coating 15) is placed "face-up" upon the O-ring 12. The cover ring is then affixed with screws to the base plate. The back face 6 of the base plate is then affixed to a helium diffuser plate in the commercial ion beam etching machine, so that the center hole 10 of the base plate is aligned with the helium exit port of the diffuser.

The end-point desired for, and therefore the appropriate method of characterization of, the HTS film undergoing low-angle ion milling will be determined by the application for which the HTS film is intended. One such application is in the propagation of high powered microwave energy. The practice of this invention results in considerable improvement to the MSI of the films so treated with the largest effect being seen in those films which before low-angle ion milling exhibit the largest divergence from the asymptotic limit, and the least effect being seen in those which exhibit the least divergence from the asymptotic limit. An additional highly beneficial aspect of the process of low angle ion milling is that film-to-film variation in MSI is much improved.

As a practical matter, it is generally desirable to remove any residual protective coating from the surface of the film after the exposure step. Strictly speaking, however, this step is not absolutely essential. It has been found, however, that leaving the protective coating on the film can result in degradation of film qualities. In the case of PMMA coating, it has been found to be satisfactory to remove the PMMA by etching the film in an oxygen plasma (1.2 mtorr, 800 watts, 13.56 MHz) for about 3 minutes.

The practice of this invention is further illustrated by the following specific Examples.

EXAMPLES

In the examples that follow, $Tl_2Ba_2CaCu_2O_8$ HTS films were deposited on either one or both sides of a $LaAlO_3$ substrate (5 cm [2 inch] diameter, 0.5 mm [0.020 inch] thick), available from Applied Technology Enterprises, Irmo, S.C. (Films deposited on both sides of a substrate are distinguished as sides A and B, respectively, in the examples.) The film(s) were deposited by a conventional two-step post-annealing process as described in W. L. Holstein et al., 1992 *Applied Superconductivity Conference*, August 1992, which is herein incorporated by reference.

The Microwave Surface Impedance (MSI) of the HTS films was determined in the following manner. The specimen was first spin-coated with Teflon AF®, an amorphous fluorocarbon polymer available from E. I. du Pont de Nemours and Company, Wilmington, Del., by the method of Yasuhiro et al., *Japanese Journal of Applied Physics*, Volume 30, pp. 2751ff (1991) which is herein incorporated by reference. The thickness of the Teflon AF® so deposited was ca. 1.5 mm. The HTS film was then placed in a C-band HTS-Sapphire resonator and subjected to 1 milliwatt of 5.55 gigahertz microwave radiation. The C-Band HTS-Sapphire resonator and the method of calculating MSI from the data obtained therewith is described in Z. Y. Shen et al., *IEEE Transactions on Microwave Theory and Techniques*, Volume 40, December 1992 and in Z. Y. Shen, *High Temperature Superconducting Microwave Circuits*, Chapter 2 and Chapter 7, Artech House, 1994. Both references are herein incorporated herein by reference.

Following determination of the MSI, the Teflon AF® was removed by etching in an oxygen plasma at a setting of 50 sccm at 200 watts for 25 minutes in a 790 series Reactive Ion Etching machine available from Plasma Therm, Inc., St. Petersburg, Fla. The chamber pressure was kept constant during the etching cycle by varying the pumping speed with an automatic throttle valve. The etch rate was 0.1 mm/minute.

After removal of the Teflon AF®, a layer of OCG PMMA Standard Resist 6% (a 6% solids solution of PMMA in chlorobenzene) available from Olin Chemical Corporation, was spin-coated at 3000 rpm for 30 seconds on the HTS film, followed by curing at 170° C. for 30 minutes. The thickness of the coating was 0.4 mm.

Specimens were low-angle ion beam milled in a model LL-250 Microetch Argon Ion beam etching system available from Veeco Instrument Inc., Plainview, N.Y.

Example 1

The HTS film was deposited on one side of the substrate. The MSI as fabricated was 310 µOhm.

The specimen was then low angle ion milled at a power of 300 V, 300 mA, and an incidence angle of 20° for 15 minutes using an adhesive to secure the specimen in position. After milling the MSI was 230 µOhm.

Example 2

The HTS film was deposited on one side. The MSI as fabricated was 449 m.

The specimen was then low angle ion milled at a power of 300 V, 300 mA, and an incidence angle of 20° for 20 minutes. The specimen was held in position during exposure by use of an adhesive. After milling, the MSI was 230 µOhm.

Example 3

The HTS film was deposited on both sides of the substrate. The MSI of the side A film was 500 µOhm and that of side B was 340 µOhm.

The side A film was low angle ion milled at a power of 300 V, 300 mA, and an incidence angle of 20° for 15 minutes, using an adhesive to secure the specimen in position. After milling, the MSI was 290 µOhm.

The side B film was then low angle ion milled at a power of 300 V, 300 mA, and an incidence angle of 20° for 15 minutes. Again, an adhesive was used to secure the specimen during exposure. After milling, the MSI was 230 µOhm.

Example 4

The HTS film was deposited on both sides. The MSI of the side A film was 490 µOhm and the MSI of the side B film was 300 µOhm.

The side A film was low angle ion milled at a power of 300 V, 300 mA, and an incidence angle of 20° for 15 minutes. After milling, the MSI was 490 µOhm. The lack of improvement in MSI was believed to be caused by contamination from the use of a metal cover ring to secure the specimen. The ring was removed and the specimen was secured in place with an adhesive. The side A film was low angle ion milled again at a power of 300 V, 300 mA, and an incidence angle of 20° for 15 minutes. After milling, the MSI was 270 µOhm.

The side B film was low angle ion milled at a power of 300 V, 300 mA, and an incidence angle of 20° for 15 minutes. An adhesive was used to secure the specimen in place. After milling, the MSI was 350 µOhm.

Example 5

HTS films were deposited on both sides of the substrate. The MSI of the side A film was 320 µOhm.

The side A film was low angle ion milled at a power of 300 V, 300 mA, and an incidence angle of 20° for 15 minutes using a Delrin® (E.I. du Pont de Nemours & Co.) cover ring. After milling, the MSI was 270 µOhm.

Example 6

An HTS film was deposited on both sides of the substrate. The MSI of the side A film was 330 µOhm.

The side A film was low angle ion milled at a power of 300 V, 300 mA, and an incidence angle of 20° for 15 minutes using a Teflon® (E. I. du Pont de Nemours & Co.) cover ring. After milling, the MSI was 280 µOhm.

Example 7

An HTS film was deposited on one side of the LaAlO$_3$ substrate. The MSI was 390 µOhm.

The specimen was low angle ion milled at a power of 300 V, 300 mA, and an incidence angle of 30° for 20 minutes using a Delrin® cover ring. After milling, the MSI was 240 µOhm.

Example 8

An HTS film was deposited on one side of the substrate. The MSI was 320 µOhm.

Following milling a power of 300 V, 300 mA, and an incidence angle of 10° for 20 minutes using a Delrin® cover ring, the MSI was 270 µOhm.

Example 9

An HTS film was deposited on one side of a LaAlO$_3$ substrate. The MSI was 430 µOhm.

After low angle ion milled at a power of 500 V, 500 mA, and an incidence angle of 20° for 10 minutes using a Delrin® cover ring, the MSI was 350 µOhm.

What is claimed is:

1. A method for removing asperities from the surface of a high temperature superconducting thin film, the method comprises exposing the surface of a high temperature superconducting film to an inert ion beam at an angle of incidence of from 5 to about 30 degrees relative to the surface of the thin film, wherein the high temperature superconducting film comprises a Tl—Ba—Ca—Cu—O superconductor.

2. The method of claim 1, wherein the HTS thin film comprises Tl$_2$Ba$_2$CaCu$_2$O$_8$.

3. The method of claim 1, wherein the angle of incidence is from 10 to 20 degrees relative to the surface of the thin film.

4. The method of claim 1, wherein the ion beam comprises an argon ion beam.

5. The method of claim 1, further comprising the step of cooling the thin film during the exposure step whereby the temperature of the film does not exceed about 120° C.

6. A method for decreasing the microwave surface impedance of a high-temperature superconducting thin film, the method comprises the steps of
   a) applying a protective coating over the surface of a high-temperature superconducting thin film; and
   b) exposing the coated thin film to an inert ion beam at an angle of incidence of from 5 to 30 degrees with respect to the surface of the coated thin film.

7. The method of claim 6, further comprising the step of removing any residual protective coating from the thin film after the exposure step.

8. The method of claim 6, wherein the protective coating is applied by spin-coating and cured prior to the exposure step.

9. The method of claim 6, wherein the protective layer comprises an organic polymer selected from the group consisting of poly(methyl methacrylate) and polyimide.

10. The method of claim 9, wherein the protective coating is poly(methyl methacrylate).

11. The method of claim 10, wherein step a) comprises spin-coating a 6% solution of poly(methyl methacrylate) followed by curing the poly(methyl methacrylate) at 170° C. for about 30 minutes.

12. The method of claim 11, further comprising the step of exposing the thin film to an oxygen plasma after the exposure step to remove any residual poly(methyl methacrylate).

13. The method of claim 6, wherein the HTS thin film comprises $Tl_2Ba_2CaCu_2O_8$.

14. The method of claim 6, wherein step b) comprises exposing the coated thin film at an incident angle of 10° to 20° relative to the surface of the coated thin film.

15. The method of claim 6, wherein the ion beam comprises an argon ion beam.

16. The method of claim 6, further comprising the step of cooling the thin film during the exposure step whereby the temperature of the thin film does not exceed about 120° C.

17. A method for decreasing the microwave surface impedance of a high temperature superconducting thin film, the method comprises the steps of
   a) coating the surface of a high-temperature superconducting thin film with a 6% solution of poly(methyl methacrylate) followed by curing the spin-coated film at 170° C. for about 30 minutes; and,
   b) exposing the coated thin film to an inert ion beam at an angle of incidence of from 5 to 30 degrees with respect to the surface of the coated thin film.

* * * * *